(12) United States Patent
Micheloni et al.

(10) Patent No.: US 7,221,602 B2
(45) Date of Patent: May 22, 2007

(54) MEMORY SYSTEM COMPRISING A SEMICONDUCTOR MEMORY

(75) Inventors: Rino Micheloni, Turate (IT); Roberto Ravasio, Carvico (IT)

(73) Assignee: STMicroelectronics S.r.l. (IT)

( * ) Notice: Subject to any disclaimer, the term of this patent is extended or adjusted under 35 U.S.C. 154(b) by 345 days.

(21) Appl. No.: 10/735,250

(22) Filed: Dec. 12, 2003

(65) Prior Publication Data

US 2004/0181643 A1 Sep. 16, 2004

(30) Foreign Application Priority Data

Dec. 12, 2002 (IT) .......................... MI2002A2629

(51) Int. Cl.
*G11C 7/00* (2006.01)

(52) U.S. Cl. ..................... 365/194; 365/233; 365/233.5

(58) Field of Classification Search ................ 365/194, 365/233.5, 233

See application file for complete search history.

(56) References Cited

U.S. PATENT DOCUMENTS 5,822,244 A * 10/1998 Hansen et al. ......... 365/185.11
5,978,891 A * 11/1999 Takeda ........................ 365/233
6,169,423 B1 1/2001 Campardo et al.
6,237,104 B1 5/2001 Micheloni et al.
6,385,078 B2 * 5/2002 Jeon ........................ 365/233.5
6,748,464 B2 * 6/2004 Mori et al. ................... 710/36

* cited by examiner

*Primary Examiner*—David Lam
(74) *Attorney, Agent, or Firm*—Lisa K. Jorgenson; J. Mark Han; Graybeal Jackson Haley LLP

(57) ABSTRACT

A memory system comprising a semiconductor memory for storing digital data, said memory being connectable to a control device in order to receive an address signal and to make data selected through the output-available address signal. The system is characterised in that it comprises a generating circuit for activating a wait signal to be forwarded to the control device during reading operations in such a way as to indicate the non-availability of the data to be read. The generating circuit is such to deactivate the wait signal, in such a way as to indicate the availability of the data to be read, following a waiting time interval correlated with an effective access time for said memory.

28 Claims, 6 Drawing Sheets

MEMORY SYSTEM COMPRISING A SEMICONDUCTOR MEMORY

PRIORITY CLAIM

This application claims priority from Italian patent application No. MI2002A002629, filed Dec. 12, 2002, which is incorporated herein by reference.

TECHNICAL FIELD

The present invention relates generally to the semiconductor memory sector and, in particular, to non-volatile memories. More particularly, the present invention relates to memory access methodologies.

BACKGROUND

Non volatile memories, such as for example, flash memories, are associated with appropriate control devices which manage the various possible operations to be performed on the memory itself such as, writing, cancellation, or reading. Possible examples of such control devices are: microprocessors, microcontrollers and DSPs (Digital Signal Processors).

With particular reference to reading operations, the data-transfer speed between the memory in which the data are stored and the control device thereof, is frequently of fundamental importance. The transfer speed, associated with the memory access time, is a parameter which assumes an ever greater importance with increasing memory dimensions.

The known art has proposed different methodologies which seek to increase the transfer speed with respect to that which is observed in the case of random access.

One of these methodologies is the page mode technique which, as is known, provides asynchronous access, i.e. not directly associated with the memory system timing signal. According to this technique, access to the memory for the reading of a word causes the reading of a pre-fixed number of words which constitute a memory page. The first word read is made available following a first pre-fixed time interval (for example, equal to 120 ns), whilst the reading of another word belonging to the same page is completed following a second time interval, shorter than the first, for example, equal to 25 ns. Indeed, this second reading is a selection from within the same page to which there has already been access. If the subsequent word to be read does not belong to the same page, it will be accessed, following the first time interval, on a new page.

Another access technique is that which is denominated as burst mode which, contrary to the former, is a synchronous type, i.e. the timings of the input and output signals are related to a clock signal generated by the system and provided to the memory. Such technology envisages that the access occurs through the transfer of a sequence of words. In order to gain access to the first word it is necessary to wait for M latency cycles in order to allow the memory to execute the reading of N words. The subsequent data appears as output, subsequent to the first word, regulated by the clock signal.

Both page mode technique and the burst mode technique have a drawback associated with the rigidity of the access methodologies. Such rigidity, which is more significant for the second technique, results in the need to use memory control devices which are based on the peculiar characteristics of each of those methods and which in certain cases must envisage the management of additional signals, otherwise not strictly necessary. Furthermore, the known modalities of access do not allow the full exploitation of the possibilities offered by the memories available today.

SUMMARY

One embodiment of the present invention is a memory system which allows a greater transmission speed of data to control devices than those of the known art mentioned above.

BRIEF DESCRIPTION OF THE DRAWINGS

Further characteristics and advantages of the present invention will arise from the following description of preferred embodiments, which are intended as indicative and non limitative, with reference to the attached figures, wherein.

DETAILED DESCRIPTION

Figure 1:
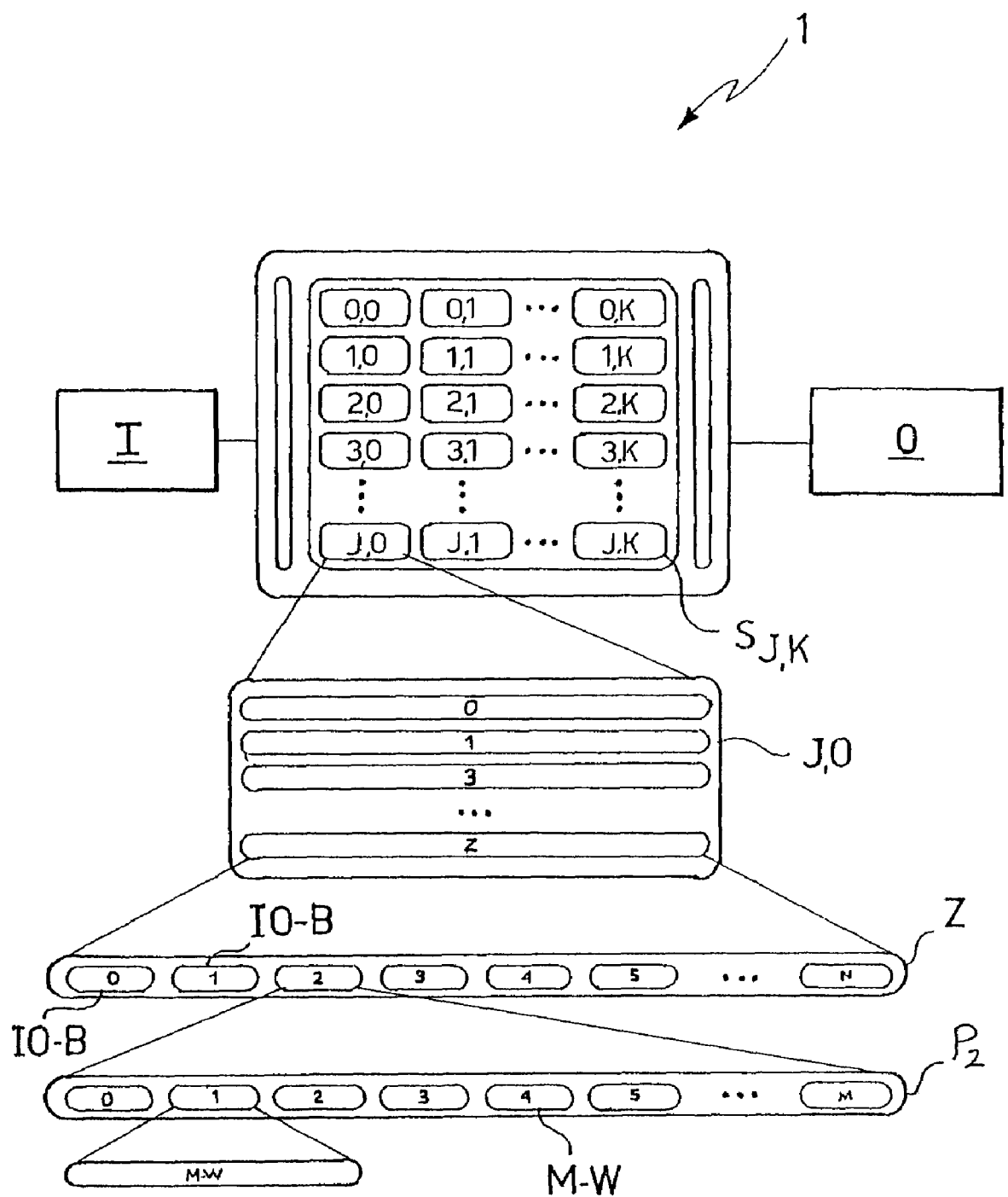
FIG. 1 shows a non-volatile memory architecture usable for an embodiment of the present invention.

FIG. 1 shows a non-volatile memory 1 architecture wherein the memory cells or locations are arranged according to appropriate hierarchical domains. For example, memory 1 is a flash memory of large dimensions i.e. having, for example, a capacity equal to 256 Mbit. Memory 1, which is connected to appropriate input I and output O circuit blocks, is organized into hierarchical domains such as sectors, rows, columns, pages and words of memory. Each of such hierarchical domains includes a plurality of sub-matrices, i.e., respectively, a plurality of sectors, rows, columns, pages and words of memory.

In particular, at a first level of subdivision the memory 1 comprises sectors $S_{jk}$ identified by the indices J,K including rows and columns. Another hierarchical domain is that of the rows (in the figure, from 0 to Z), included within each sector. The row of index Z contains a number N of pages $P_0$–$P_N$ each including M words of memory or memory words, M-W composed of a pre-established number of bits stored within memory cells.

The above-described hierarchical subdivision, which is in itself entirely conventional, is convenient for the selective cancellation of sectors of memory 1. As is known, in the memory 1 reading stage, address signals are decoded by appropriate row and column decoders, in such a way as to provide electrical signals to the selected memory cells which allow the reading of the stored value.

It should be remembered that by memory access time $t_{acc}$ is meant the time interval which takes place between a change of address and the instant in which the memory is able to make the requested data available.

In the reading stage of a conventional memory having the structure of the memory 1, the access time $t_{acc}$ to a single memory location may be subject to various contributions of indetermination, amongst which, a topological indetermination, a parametric indetermination, and a functional indetermination are remembered.

Ideally, the memory access time $t_{acc}$ is constituted by the summation of the delay necessary in order to cross the input output blocks $t_{acc\text{-}fixed}$ and the delays $tacc_{domain}(An)$ for descending into the domains which make up the memory 1. Such access time is expressible through the following formula:

$$t_{acc}(A_n / A_{n-1}, A_{n-2} \ldots) = t_{acc\text{-}fixed} + \sum_{domain} t_{acc_{domain}}(A_n / A_{n-1}, A_{n-2} \ldots) \quad (1)$$

wherein $A_n$ represents the address of the memory location which is accessed in an $n^{th}$ reading cycle, and $A_{n-1}$, $A_{n-2}$ . . . represents the addresses of the cells selected in the reading operations preceding that of the $n^{th}$. The access time expressed by formula (1) is, generally dependent on the position within the memory matrix of the desired word WM and is also dependent on the position of the words WL selected in the preceding stages of reading.

For clarity purposes, it is possible to consider the particular case wherein the access time $t_{acc}$ is dependent only upon the last operation executed. In this situation formula (1) is simplified as $$t_{acc}(A_n / A_{n-1}) = t_{acc\text{-}fixed} + \sum_{domain} t_{acc_{domain}}(A_n / A_{n-1}) \quad (2)$$

It is observed that the delay introduced by each domain assumes a different value depending on whether or not the two locations $A_n$ and $A_{n-1}$ belong, for example, to the same domain, to the same sector J,K or to the same row.

The topological indetermination is bound to the fact that the overall access time $t_{acc}$ is strongly contingent upon the topology of the memory but, typically, only one part of this topology is known and made available to the user.

With reference to the parametric indetermination, it is to be noted that the access time for all the domains and also the input I and output O blocks may depend on numerous parameters (temperature, supply voltage, process parameters etc.) which can considerably influence the access time. It is also to be noted that, according to conventional methodologies, such as those mentioned above, i.e. page mode and burst mode, with the aim of overriding such parametric variabilities, the user makes reference, for the management of reading operations, to the most unfavorable conditions.

Functional indetermination refers to contributions to the indetermination of access time deriving from possible contrivances which predictively predispose the memory for rapid access, mechanisms which interrupt or alternate the normal flow of operation of the memory such as refresh operations (rewriting the memory), reset, return from power-down i.e., return from a state of low power consumption, etc.

Figure 2:
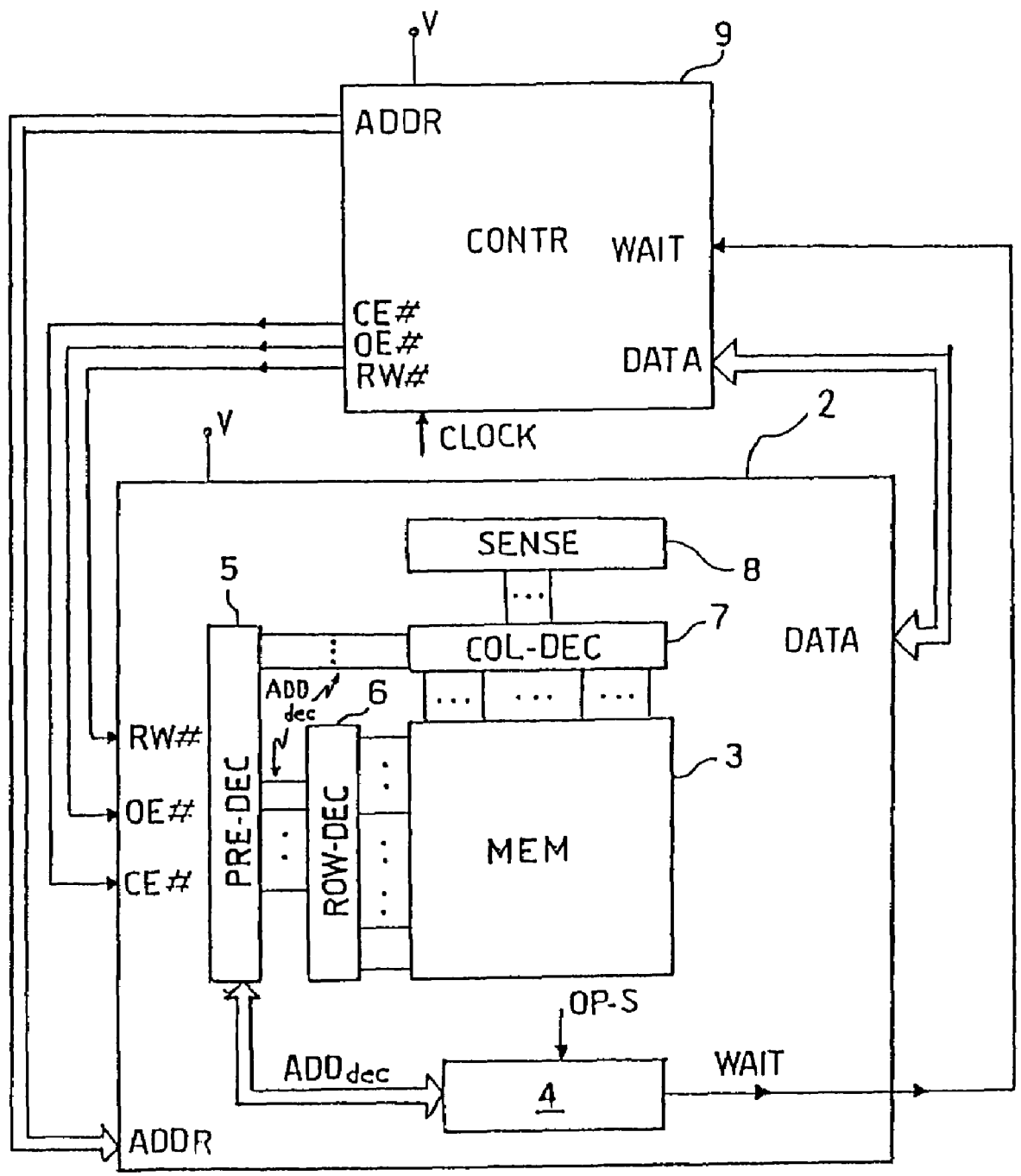
FIG. 2 shows a particular example of a digital system in accordance with an embodiment of the present invention.

FIG. 2 shows a particular example of a digital system 100 in accordance with an embodiment of the present invention and including a memory system indicated on the whole by the number 2 and a controller device CONTR 9. The memory system 2 in turn comprises a memory MEM 3 and a wait-signal (WAIT) generating circuit 4.

The memory 3 is, for example, organized hierarchically, in an analogous manner to that described with reference to the memory 1 of FIG. 1.

Furthermore, the memory system 2 comprises a plurality of architectural blocks such as, an input block including a pre-decoder PRE-DEC 5 connected to a row decoder ROW-DEC 6 and to a column decoder COL-DEC 7, which may have conventional function and structure and which, therefore, do not require further description herein. The pre-decoder 5 receives a coded address signal ADDR relating to a specific memory cell over the input lines, and provides a corresponding decoded address signal $ADD_{dec}$ over a plurality of output lines.

In accordance with the hierarchical organization of the memory 3, the decoded address signal $ADD_{dec}$ carries a binary code comprising a plurality of address code groups each referring to a hierarchical domain into which the memory 2 is subdivided.

Such plurality of code groups, each constituted by one or more bits, comprises ADDR(sec), ADDR(row), ADDR(col), ADDR(page) codes (not shown in FIG. 2) of different positions which identify respectively (progressing from the most significant bits to the least significant) a sector, a row, a column, a page and a word of the memory 3.

As will be clear to those skilled in the art, the row 6 and column 7 decoders connected to appropriate output lines of the pre-decoder 5 have level translation functions, i.e. they are such to provide, on the basis of the decoded address $ADD_{dec}$, appropriate voltage and current values to the bit-line and word-line of the memory matrix allowing the selection of the particular word desired.

The memory system 2 output block also comprises a reading or "sense" SENSE circuit 8, which is known per se to one of ordinary skill in the art and therefore not described in any further detail. As is known, the sense circuit 8 is a circuit (for example including an amplifier and a voltage comparator) which allows making the selected data stored within the specific word available for output from the memory 3.

The generating circuit 4 allows the activation of a wait signal (WAIT) to be forwarded to the control device 9, during reading operations in such a way as to indicate the non-availability of the data to be read. Furthermore, the generating circuit 4 allows the deactivation of the WAIT signal, following an appropriate waiting time interval $t_w$, in such a way as to indicate the availability of the data for reading to the control device 9. The waiting time interval $t_w$, during which the generating circuit 4 keeps the wait signal WAIT activated, is correlated with the actual access time $t_{acc}$ of the memory 3. Advantageously, this time interval has a duration which is variable as a function of the address signal $ADD_{dec}$ and at least one operating parameter of the memory system 2. In other words, the waiting time interval $t_w$, during which the wait signal WAIT remains active, may not always be the same in all reading operations but may vary from one reading operation to another, varying with both of the address signal $ADD_{dec}$ associated with a current reading operation with respect to a preceding operation, and varying with the operating conditions of the memory system 2.

According to one preferred embodiment of the invention this waiting time interval $t_w$ is a function of the temperature T at which the memory system 2 actually operates.

Furthermore, the waiting time interval may either also be dependent on the memory system supply voltage V.

The control device CONTR 9 is, for example, a conventional microprocessor, microcontroller or a digital signal processor DSP intended to receive, amongst other signals, the WAIT signal and to provide data and memory system control and management signals (for example, address ADDR, data DATA, chip enabling CEO#, reading R, writing W# signals) to the memory 2. The control device 9 uses the WAIT signal for managing the reading of the memory 3, which occurs asynchronously, with respect to the timing signals associated with the system 100.

With reference to a reading cycle of the data in the memory 3 by the control device 9, the WAIT signal may assume two logic levels (for example, high i.e. active, and low i.e. inactive) which indicate, respectively, that the memory 3 has not yet made the data to be read available for the control device 9 and, instead, that the data itself have been made available by the memory.

The controller device 9 recognizes, on the basis of the logic level of the WAIT signal, if the data has or has not been made available by the memory 3. In the case in which the data is not available, the controller device 9 remains waiting, i.e. does not proceed with the reading of the memory 3, until the WAIT signal is deactivated or, in other words, until such a time when the logic level of the wait signal itself is inverted. When the WAIT signal indicates the availability of the data, the controller device 9 completes the reading operation.

Figure 3:
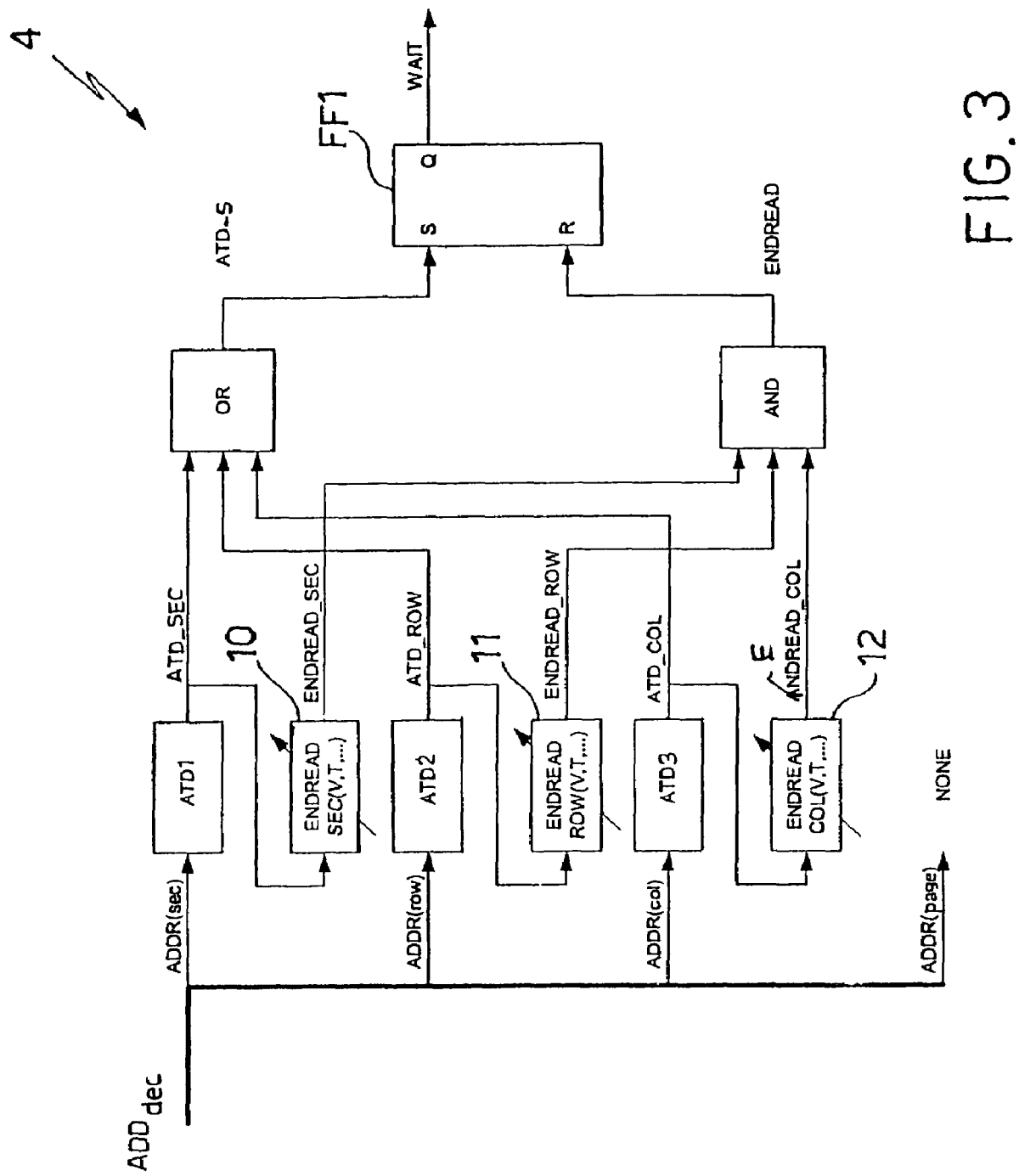
FIG. 3 shows a preferred embodiment of a wait-signal generating circuit usable in the digital system of FIG. 2.

FIG. 3 shows a preferred embodiment of the WAIT signal generating circuit 4 in accordance with the present invention.

The generating circuit 4 comprises address transition detection means such to receive at least part of the decoded address signal $ADD_{dec}$ as input and generate an ATD-S signal representative of a modification thereof.

In particular, such detection means include at least one address transition detection circuit or ATD circuit realizable by conventional technologies known to those skilled in the art, and intended to receive a specific group of bits of the decoded address signal $ADD_{dec}$ available on a related bus.

In greater detail, according to the example, the transition detection means include three address-transition-detection circuits ATD1, ATD2, ATD3, each intended for receiving as input, respectively, the group of sector ADDR(sec), row ADDR(row) and column ADDR(col) address bits, appropriately extracted from the bus which carries the address $ADD_{dec}$.

The address-transition-detection circuits ATD1, ATD2, ATD3 allow the generation on a corresponding output line ATD_SEC, ATD_ROW, ATD_COL of a corresponding impulse signal upon detection of an address change $ADD_{dec}$ which implies the change of sector, row or column.

The output lines ATD_SEC, ATD_ROW, ATD_COL of the three ATD circuits are connected to the input of a logic gate OR the output thereof, on which the detection signal ATD-S is available, is connected to the set input S of a first RS type flip-flop FF1, realizable with NOR gates (not shown) for example.

In the gate OR are combined the impulse signals outputting from each ATD_SEC, ATD_ROW, ATD_COL detection circuit, in such a way as to obtain the ATD-S detection signal, which, when forwarded to the first flip-flop FF1, will allow the activation of the wait signal WAIT.

Possible examples of ATD circuits of the type which may be used to make the address-transition-detection circuits ATD1, ATD2, ATD3 are described in U.S. Pat. Nos. 6,169,423 and U.S. Pat. No. 6,237,104, which are incorporated by reference.

Furthermore, the generating circuit 4 comprises circuital means of end-wait signalling having the role of generating an end wait signal ENDREAD which commands the deactivation of the wait signal WAIT once said waiting time interval $t_w$ has passed.

In more detail, the generating circuit 4 is provided with three delay networks ENDREADSEC 10, ENDREADROW 11, ENDREADCOL 12 each of such a type as to receive as input, the detection impulse ATD_SEC, ATD_ROW and ATD_COL outputting, respectively, from the address detection circuits ATD1, ATD2, ATD3.

The delay networks 10, 11, 12 are associated with a corresponding hierarchical domain of the memory 3. Furthermore, such delay networks 10, 11, 12 provide a corresponding delayed signal (for example, a delayed copy of the input signal) ENDREAD_SEC, ENDREAD_ROW and ENDREAD_COL over corresponding output lines.

The output lines of the delay networks 10, 11 and 12 are connected to the input of a logic gate AND, the output of which is connected, in turn, to the reset input R of the first flip-flop FF1.

In the AND gate are combined the impulse signals output from the delay networks 10, 11, 12, in such a way as to obtain the end-wait signal ENDREAD which, once sent to the first flip-flop FF1, allows the deactivation of the wait signal WAIT.

Each delay network 10, 11, 12 is such to introduce a time delay T10, T11, T12 in the corresponding input signal (i.e. of one of the transition detection signals, ATD_SEC, ATD_ROW, ATD_COL) which substantially reproduces the actual access time $t_{acc}$ to the memory 3 which occurs in case an address is changed within that specific hierarchical domain.

In particular, the delay network 10 introduces a delay substantially equal to the access time in relation to the memory system 2 and evaluated in the case of an address change which implies a change of sector. For example, the address change implies the passage from sector 0,0 of FIG. 1, to sector 3,k.

Similarly, the delay network ENDREADROW 11 (ENDREADCOL 12) is such to introduce a delay substantially equal to the access time in the case of an address change which implies a change of row (column). The delayed signals ENDREAD_SEC, ENDREAD_ROW and ENDREAD_COL, when activated, indicate respectively that, in the case of a reading operation which implies the change of address within the hierarchical domain (for example, change between columns) to which the relevant delay networks are associated, access to the memory is terminated and the data is made available.

Advantageously, the aforesaid circuital means of end-wait signalling of waiting comprise at least one dummy circuit block realized in such a manner as to influence the duration of the waiting-time interval $t_w$ by an amount varying as a function of an operative parameter of the system (for example, the temperature and/or the supply voltage) and according to a behavior which reproduces that associated with at least one architectural block of the memory system 2 itself.

Prior to describing a particular embodiment of one of the delay networks, an example of the operation of a digital system 100 (FIG. 2) is described in the following.

Figure 4:
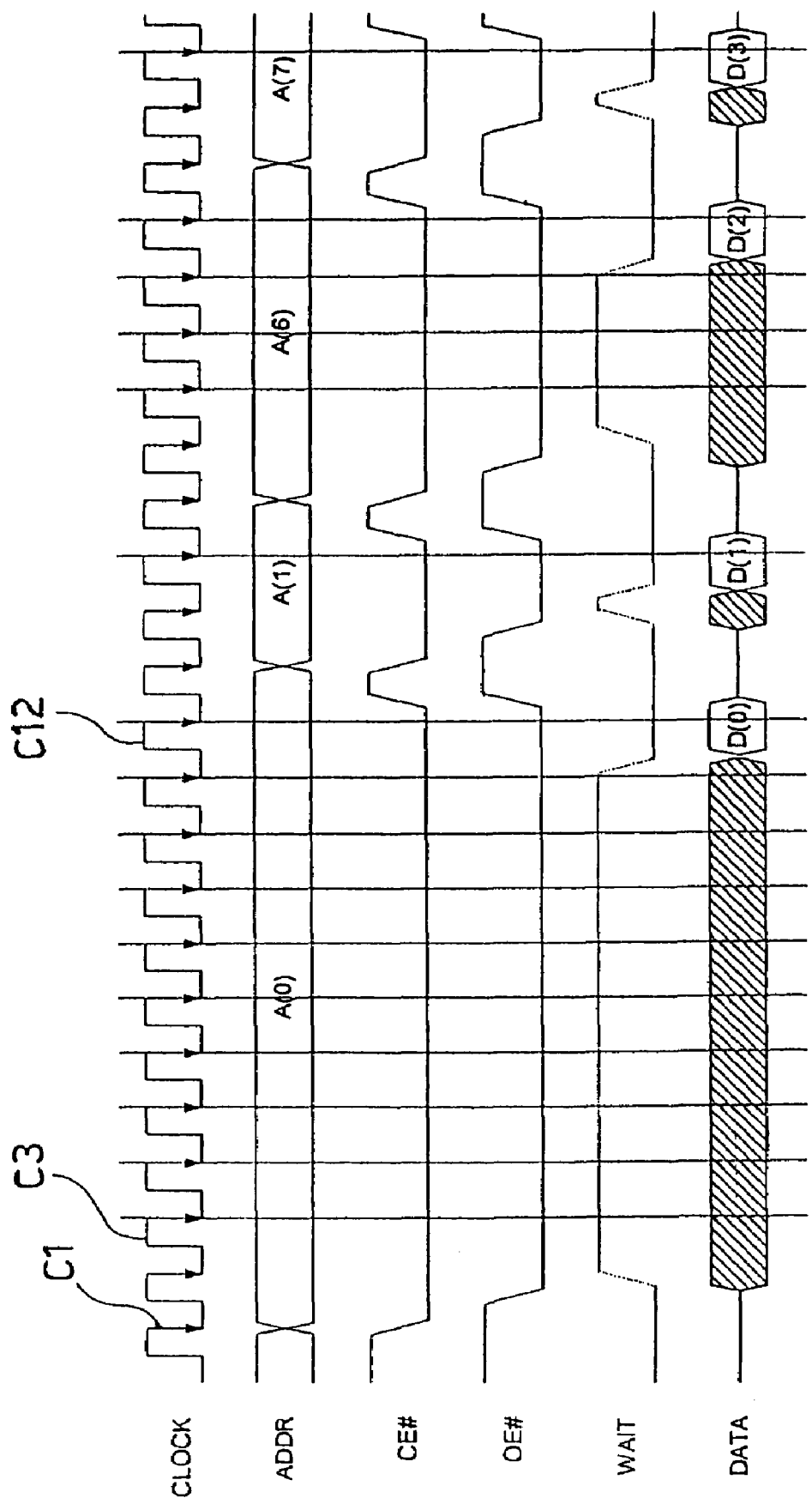
FIG. 4 shows examples of signals usable in the digital system of FIG. 2 during reading cycles.

Reference is made to FIG. 4, in which some reading cycles of the memory 3 are represented.

In particular, FIG. 4 shows an example of a clock impulse signal (CLOCK signal, generated by an appropriate device) forwarded to the control device 9 but not to the memory system 2; the address signal ADDR; conventional chip enabling CE# (Chip Enable) and output enabling OE# (Output Enable) signals; the wait signal WAIT, and the signal DATA representing the output data.

The CE# and OE# signals may be received by the memory system 2 since they are sent by the controller 9.

According to the example of FIG. 4, in the first reading cycle of the memory system 3 the situation is hypothesised in which an address change, from that preceding to that current A(0), has occurred, which implies a change of row, sector and column within the memory matrix.

Furthermore, it is supposed that, apart from the wait signal WAIT, the control device 9 has been set in such a way as to consider a preset access time equal to two clock cycles and, for example, on the whole equal to 20 ns. According to one particular example, such a preset access time of 20 ns may correspond to two cycles of the clock which times the control device 9 at a frequency 100 MHz.

With the falling edge C1 of the clock signal CLOCK, the control device 9 begins a reading cycle by changing the address ADDR, providing an address A(0) to the memory system 2, and activating the chip enabling CE# and output enabling signals OE# (for example, both low active).

The change of address ADDR which has led to the address A(0) is detected by the generating circuit 4 of the memory system 2, which brings the wait signal WAIT into the active state.

In particular, a change of sector, row and column having occurred, i.e. a change of the corresponding groups of ADDR(sec), ADDR(row) and ADDR(col) bits, the address transition generating circuits ATD1, ATD2, ATD3 each generate an impulse on the respective output lines, ATD_SEC, ATD_ROW, ATD_COL.

This causes an impulse signal ATD_S to be generated as output from the gate OR of FIG. 3 (in the example, of high logic level), which controls the input set S of the first flip-flop FF1, so as to activate the wait signal WAIT, bringing it to a high logic level (R=0, S=1; Q=1).

Therefore, the control device 9, on a falling edge $C_3$ of the clock signal CLOCK, samples, i.e. detects, the active WAIT signal and then defers, i.e. delays, the completion of the data reading. Until the wait signal WAIT is deactivated, the control device 9 does not consider the data present on the data busses DATA to be valid.

The impulse present on each of the output lines ATD_SEC, ATD_ROW, ATD_COL of the address transition generating circuits ATD1, ATD2, ATD3 is also forwarded to the variable delay networks 10, 11 and 12 respectively, shown in FIG. 3.

According to the particular case described, the signals present on the ENDREAD_SEC, ENDREAD_ROW and ENDREAD_COL outputs of the three temporal networks 10, 11 and 12 will remain at a low logic level for the entire duration of the specific time delay introduced by each of such networks.

The signals present on the ENDREAD_ROW and ENREAD-COL outputs, corresponding to the variable delay networks in relation to the row and column change, are the first to proceed to a high logic level. Subsequently, the signal present on the ENDREAD_SEC output also proceeds to a high logic level.

Under such conditions, an end of wait-impulse signal ENDREAD is generated as output from the gate AND of FIG. 3, which drives the reset input R of the first flip-flop FF1, deactivating the wait signal WAIT (S=0 and R=1; Q=0).

Generally, according to the example of FIG. 4, the WAIT signal has been kept active by the memory system 2 for eleven clock cycles, i.e. during the time necessary for the memory 3 to make the data to be read available for the specific address change, indicated above. In particular, it is to be noted that the delays (T10, T11, T12) introduced by each of the delay networks are a function of the temperature at which the memory system finds itself and/or of the supply voltage thereof.

Still with reference to the example of FIG. 4, following such eleven clock cycles, the wait signal WAIT is deactivated. The control device 9, on the falling edge of the impulse $C_{12}$ detects the wait signal WAIT to be in a deactivated state and therefore considers the data D(0) made available by the memory system 2 to be valid or, in other words, concludes the reading of the data. At the conclusion of the reading, the control device 9 deactivates the enabling signals of both the chip and the outputs CE# and OE#.

In a second example reading cycle, the address ADD changes from A(0) to A(1), implying only a change of the word to be read inside the same page.

The wait-signal WAIT generating circuit 4 operates in a similar manner as shown for the address A(1) and which is evident for those skilled in the art from the above description.

In this case, the WAIT signal remains active for a time interval which is less than the preceding case, and in such a way that on the second clock cycle which follows the address change, the controller device 9 may conclude the reading of the data to be read, indicated with D(1).

In a third example of a reading cycle, the address ADD changes from A(1) to A(6), and it is supposed that such a change leads only to a change of column whilst the sector and the row have remained unaltered.

In this case, the WAIT signal remains active in such a way as to delay the reading of the data to be read, D(2), by five clock cycles.

In the final example, a change of address from A(6) to A(7) is again shown, which leads to just the changing of the word inside the same page.

Once again, the data to be read, D(3), is made available only after two clock cycles following the occurrence of the address change.

Figure 5:
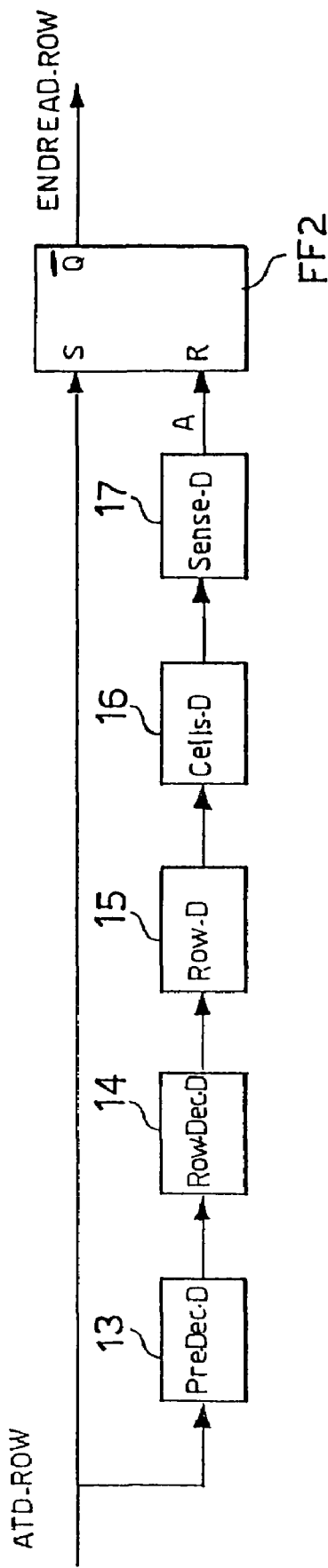
FIG. 5 shows a preferred embodiment of a delay network included in the wait-signal generating circuit of FIG. 3.

In FIG. 5 is shown a preferred embodiment of the delay network 11 included within the wait-signal WAIT generating circuit 4, shown in FIG. 3, and relating to the generation of the ENDREAD_ROW signal corresponding to the change of address including the change of row. This network 11 is such to introduce the time delay T11 into the signal which traverses it.

The network 11 of FIG. 5 comprises a group of dummy circuit blocks, appropriately connected to one another and each associated with a corresponding architectural block of the memory system 2 or a structural block of the memory 3. For example the architectural blocks to which each of the dummy blocks are associated may be the pre-decoder 5, the row decoder 6, the column decoder 7 and the sense circuit 8. Furthermore, the structural blocks of the memory 3 to which each of the dummy circuit blocks are associated are the rows, the columns or the cells of the matrix itself.

Each dummy block introduces a corresponding time delay, which substantially reproduces that introduced by the architectural or structural block to which it is associated, on the signals which pass through it (such as for example, address signals, voltage signals, current signals) for selecting a data stored within the memory 3, during a reading operation.

Advantageously, each dummy circuit block is such that the corresponding time delay is variable as a function of the operative parameter of the memory system 2 and according to a behavior which substantially reproduces that of the corresponding architectural or structural block.

In greater detail, the variable delay network 11 comprises a pre-coding delay block Pre-Dec-D 13 which reproduces the time delay introduced by the pre-decoder 5 during the reading operation. The pre-coding delay block 13 is intended to receive the transition signal ATD-ROW, which indicates the row change, as input.

Furthermore, the variable delay network 11 includes a row-decoding delay block Row-Dec-D, 14, connected in series to the pre-coding delay block 13, which reproduces the time delay introduced during the reading operation by the row decoder 6.

Within the variable delay network 11 are also included a row delay block Row-D 15 and a cell delay block Cells-D 16, connected in series to one another and to the preceding blocks 13 and 14. The row Row-D and cell Cells-D delay blocks reproduce, respectively, the time delay due to the propagation of the signal applied to the memory 3 within the selected row, and the delay introduced by the cell selected for reading.

In series with the cell delay block 16 is connected a sense delay block Sense-D 17, representative of the delay introduced by the sense circuit 8, during the reading of a data.

Such delay blocks 13–17 are appropriately sized during the production stage, so as to introduce the desired delays.

Advantageously, each delay block 13–17 is made using one or more electronic components belonging to the structural or architectural block of which it represents the delay, appropriately connected in such a way as to define an overall delay.

For example, the row delay block Row-D 15 is made using a particular row of the same memory 3 expressly excluded from the task of storing data and which is, preferably, placed inside the memory itself in such a position as to offer the worst conditions in relation to the access time (greatest delay). Furthermore, it is remembered that the row decoder 6 has the function of level translation and, typically, includes a plurality of elementary translation blocks. One of such elementary blocks constituting the row decoder 6 is, for example, intended to form the row decoding delay block Row-Dec-D, 14.

Analogously, the row pre-decoder 5 typically includes a plurality of logic gates, intended to select a row, and the corresponding pre-coding delay block 13 is made using an elementary logic circuit, included within the same row pre-decoder 5, and comprising an appropriate number of logic levels with the same load.

The cell delay block 16 comprises an appropriate cell of the memory 3 not intended for storing data. The sense delay block 17 is, for example, formed using a sense-circuit elementary block having solely time delay functions and not used for reading.

With this particularly advantageous choice, the dummy delay route has, due to its construction, a delay and a behavior essentially identical to that of the actual route. Furthermore, the delay blocks 13–17 made as described above, may be finely tuned (trimming operations) following measurements and/or simulations in order to obtain the desired delay value with greater precision.

The delay network 11 comprises a second RS type flip-flop FF2 (for example, made with NAND gates) having the set input S intended to receive the row transition signal ATD_ROW and the reset input R intended to receive an output signal A from the sense delay block 17.

An output $\overline{Q}$ from the second flip-flop FF2 carries the row end wait signal ENDREAD_ROW.

Figure 6:
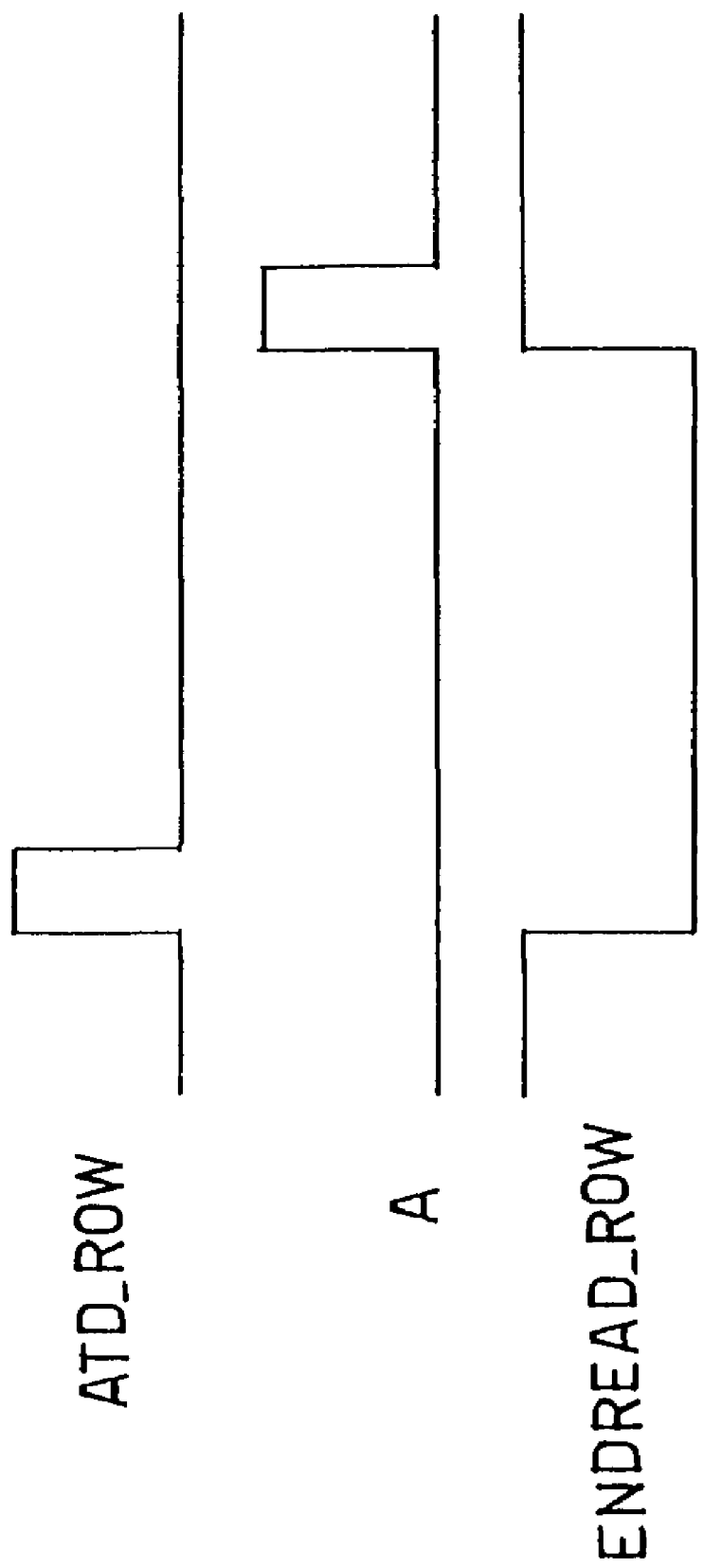
FIG. 6 shows a signal timing of the digital system of FIG. 2 according to an embodiment of the invention.

For a working example of the delay network 11, reference is also made to FIG. 6 in which some example timings of the above defined ATD-ROW, A, and ENDREAD_ROW signals are shown.

Upon activation of the ATD_ROW signal (for example, this assumes the logic level of 1) the set input S of the second flip-flop FF2 is equal to 1, whilst the reset input R will remain equal to 0. In such an input configuration (S=1, R=0) the output $\overline{Q}$ and, therefore, the row-end-wait signal ENDREAD_ROW assumes a low logic level, $\overline{Q}$=0.

Following a time interval necessary for the propagation of the ATD_ROW impulse across the delay blocks 13–17, the output A will assume a high logic level, e.g. A=1. In such an input configuration (S=0 and R=1) the output $\overline{Q}$ will assume a high logic level, i.e. ENDREAD_ROW=1.

The other data-availability detection networks 10, 12 included within the generating circuit 4 are analogous to that described above. In particular, the delay network 10 relating to the address change which envisages the change of sector is such to introduce an overall delay greater than the network 11 whilst, the delay network 12 which refers to the address change which envisages a column change will have a delay which is less than the two networks 10 and 11. For example, the delay network 12 will also include a column decoder delay block and a column delay block (not shown). This column decoder delay block and the column delay block reproduce, respectively, the time delay introduced, during the reading operation, by the column decoder 7 and the time delay due to the propagation of the signal applied to the memory 3 within the selected column.

The above-described embodiments of the present invention may be applied, using known and commercially available control devices, to memories of a known type with the addition of an appropriate wait signal WAIT generating circuit.

For example, a known DSP (Digital Signal Processor) by Motorola from the DSP56xxx family, such as a DSP56302A may be used.

Indeed, such a DSP, well known to those skilled in the art, has a TA# input (Transfer Acknolowedge, low active) which allows the addition of wait cycles to the transfer operation. According to an embodiment of the invention, a flash memory provided with a wait signal WAIT generating circuit (high active) may be connected to this DSP in such a way as to provide the wait signal WAIT to the TA# input. In such a case, even if the aforementioned Motorola DSP is not equipped with page mode type management modality, thanks to the functionality provided by the wait signal it is however possible to carry out a page mode type transfer.

Furthermore, an embodiment of the present invention is also applicable to DSPs equipped with an input for a signal which allows the addition of wait cycles to the transfer but which require that this signal will have active-low logic. In such a case, an active-low WAIT wait signal, WAIT# may be provided to such DSP devices. For example, the Texas Instruments DSPO model TMS320c60x is equipped with an input for an ARDY (Asynchronous Ready) signal, which may be connected to a flash memory for receiving the active-low waiting WAIT# signal.

In order to be able to manage both categories of control devices (those which use a low-active WAIT signal or those which use a high-active WAIT), the memory systems may be differentiated by providing them with an appropriate logic device (in particular, an inverter) which will allow the inversion of the WAIT signal.

Advantageously, in order to not differentiate the memory systems, memory system 2 may envisage means of sampling (not shown) which upon emerging from a reset state of memory 3, sample the signal present on the wait signal WAIT line. The sampled value will then be used in the following as the inactive level of the WAIT signal.

With this aim, the output line of the memory system 2 on which the wait signal WAIT is present is connected to a terminal of a resistive element (not shown) having the other terminal connected to ground in the case of an active WAIT for a high logic value, or connected to the supply voltage in the case of an active WAIT for a low logic value.

The digital system 100 in accordance with these embodiments of the present invention is particularly advantageous, in that it allows the increasing of the memory data transmission speed to a control device, with respect to conventional systems. In particular, the presence of the generating circuit 4 and the wait signal WAIT allows the controller device, to which the memory system is connected, to use the maximum possible speed allowed by the generation of the wait signal or WAIT.

Furthermore, such a memory system, which takes account of the preceding address signal and of that of the current, as well as the hierarchical organization of the memory for the generation of the wait signal, allows the reduction of the consequences of the topological indetermination of the memory access time.

Thanks to the use of dummy elements, the digital system 100 also reduces the consequences of the parametric indetermination of the memory access time.

Furthermore, an embodiment of the present invention is advantageous for the management of the re-entry stages of a memory system, such as memory system 2, from reset or from power-down. In this case, this embodiment reduces the consequences of the functional indetermination of the access time on the data transfer speed.

It is considered that for a flash memory, for example of the multilevel type, the time interval $T_D$ required by the memory upon emerging from a reset or power-down in order that the voltages produced by the appropriate voltage boosters are restored (not shown) may be 10 microseconds.

During this initial interval $T_D$ the memory system 2 is not operative and the user should refrain from carrying out operations on the system itself.

It is to be noted, however, that in various cases, a conventional control device such as, for example, a microprocessor, a microcontroller, a DSP or an MMU (Memory Manager Unit) carries out access to the external memory immediately after having been freed from the corresponding reset state (boot from external memory). In other words, the conventional control device attempts to access the memory system prior to this being actually operative.

According to conventional techniques, in order to correctly manage such a situation, it is necessary to have a flash memory reset signal available that is anticipated with respect to that of the aforementioned $T_D$ time interval control device reset, necessary for the re-entry of the memory system from reset. All this entails an additional cost for the system. An analogous situation is valid for re-entry from power down.

Instead, thanks to an embodiment of the present invention, the control device and the memory system may be brought into the reset state at the same time. It will be the generating circuit 4, included within the memory system 2, using additional signals (indicated with OP-S in FIG. 2) provided by the memory system and relating to the achievement of a particular operating state, to activate and deactivate the wait signal WAIT in such a way as to prolong the waiting of the control device 9 by the time necessary for the restoration of the operating conditions of the memory for achieving the availability of the data.

For example, such additional signals OP-S are normally generated by conventional circuits present within the memory system, such as power on circuits, circuits related to the status of the pumps, or circuits which signal the completion of system initialisation.

It is to be noted that an embodiment of the present invention is particularly advantageous for high-capacity flash memories but may be conveniently applied to other types of memories such as, for example, EPROM, EEPROM, SRAM, DRAM memories.

Furthermore, the memory system 100 of FIG. 2 may be included in a larger system such as a computer system.

From the foregoing it will be appreciated that, although specific embodiments of the invention have been described herein for purposes of illustration, various modifications may be made without deviating from the spirit and scope of the invention.

What is claimed is:

1. A memory system comprising a semiconductor memory for storing digital data, said memory being connectable to a control device for receiving an address signal and providing a data on an output selected by means of an address signal, wherein further comprising a generating circuit for activating of a wait signal to be sent to the control device during reading operations indicating the non availability of the data to be read, and for deactivating the wait signal indicating the availability of the data to be read after a waiting time interval correlated with the actual access time of said memory, this waiting interval having a duration that is variable as a function of the address signal and of at least one operative parameter of said memory system.

2. The system according to claim 1, wherein the generating circuit comprises a circuit for generating an end-wait signal, following said waiting interval, which controls the deactivation of the wait signal.

3. The system according to claim 1, wherein said at least one operative parameter comprises a memory supply voltage.

4. The system according to claim 1, wherein said at least one operative parameter comprises a temperature at which the memory system operates.

5. The system according to claim 1, comprising a device for generating a timing signal to be supplied to the control device, and wherein the generating circuit is configured to activate and deactivate the wait signal asynchronously with respect to the timing signal.

6. The system according to claim 1, wherein said memory comprises a flash memory.

7. The system according to claim 1, wherein said memory is arranged according to a plurality of hierarchical domains of the type including memory sectors, rows, columns and words.

8. A memory system comprising a semiconductor memory for storing digital data, said memory being connectable to a control device for receiving an address signal and providing a data on an output selected by means of an address signal, wherein further comprising a generating circuit for activating of a wait signal to be sent to the control device during reading operations indicating the non availability of the data to be read, and for deactivating the wait signal indicating the availability of the data to be read after a waiting time interval correlated with the actual access time of said memory, this waiting interval having a duration that is variable as a function of the address signal and of at least one operative parameter of said memory system, and wherein the generating circuit comprises an address transition detector for receiving at an input the address signal and generating a detection signal representative of a modification thereof, the generating circuit being such to activate the wait signal starting from the detection signal.

9. The system according to claim 8, wherein the address signal carries a plurality of address code groups each referring to a hierarchical domain into which the memory is subdivided, and in which said address transition detector comprise a plurality of transition detection circuits each intended to generate a corresponding transition signal representative of a modification of one of said code groups, the detection signal being obtained by combining the transition signals.

10. The system according to claim 8, wherein the circuit for generating an end-wait signal is connected to a detector and comprises a plurality of delay networks each associated with a hierarchical domain of the memory, for receiving a corresponding transition signal as input and to generate a corresponding delayed signal, the end wait signal being obtained by a combination of the delayed signals.

11. The system according to claim 10, wherein said plurality of delay networks comprises a first delay network associated with a first hierarchical domain of the memory including a plurality of sub-matrices of the memory, the first delay network being such to introduce into the propagation of the corresponding transition signal which crosses it, a first time delay evaluated on the basis of the actual access time of the memory which occurs following a change in the address signal which implies a change in the sub-matrix within the first hierarchical domain.

12. The system according to claim 11, wherein each delay network of the plurality of delay networks comprises a group of dummy circuit blocks each associated with a corresponding architectural block of the memory system or structural block of the memory system, each dummy circuit block introducing a second time delay substantially reproducing that introduced by the architectural or structural block to which it is associated.

13. The system according to claim 12, wherein the second time delay of each dummy circuit block is variable as a function of said at least one operative parameter of the memory system and according to a behaviour essentially reproducing that of the corresponding architectural or structural block.

14. The system according to claim 12, wherein at least one of said dummy circuit blocks includes one or more electronic components belonging to the structural block or the architectural block to which the dummy circuit block is associated.

15. A memory system comprising a semiconductor memory for storing digital data, said memory being connectable to a control device for receiving an address signal and providing a data on an output selected by means of an address signal, wherein further comprising a generating circuit for activating of a wait signal to be sent to the control device during reading operations indicating the non availability of the data to be read, and for deactivating the wait signal indicating the availability of the data to be read after a waiting time interval correlated with the actual access time of said memory, this waiting interval having a duration that is variable as a function of the address signal and of at least one operative parameter of said memory system, wherein the generating circuit comprises a circuit for generating an end-wait signal, following said waiting interval, which controls the deactivation of the wait signal, and wherein said circuit for generating an end-wait signal comprises at least one dummy circuit block of such a type as to influence the duration of said waiting interval by an amount that is variable as a function of at least one operative parameter of the memory system and according to a behavior essentially reproducing that associated with at least one architectural and/or structural block of the memory system.

16. The system according to claim 15, wherein said at least one architectural block is one of the following blocks: an address signal pre-coder, a row decoder, a column decoder, a sense circuit.

17. The system according to claim 15, wherein said at least one structural block is one of the following blocks: a memory row, a memory column, a memory cell.

18. A wait circuit for a memory having multiple domains each having a respective delay times, the wait circuit comprising:
an address-transition-detect circuit operable to receive an address signal having multiple sections that respectively correspond to the domains, to detect respective signal transitions in the sections, and to generate respective transition-detect signals in response to the signal transitions; and
a delay circuit coupled to the address-transition-detect circuit and operable to transition a wait signal to a wait value in response to the generation of a transition-detect signal, to transition respective delay signals to proceed values substantially the respective delay times after the generation of the corresponding transition-detect signals, and to transition the wait signal to a proceed value when all of the delay signals have proceed values.

19. A wait circuit for a memory having multiple domains that each have a respective delay time, the wait circuit comprising:
an address-transition-detect circuit operable to receive an address signal having multiple sections that each correspond to a respective one of the domains and to detect respective signal transitions in at least two of the sections; and
a delay circuit coupled to the address-transition-detect circuit and operable to transition a wait signal to a wait value in response to a detected signal transition and to transition the wait signal to a proceed value after or approximately after the longest one of the delay times that correspond to the detected transitions.

20. The wait circuit of claim 19 wherein the delay circuit:
comprises dummy circuits that are each operable to transition a respective delay signal to a proceed value after or approximately after the delay time of a corresponding domain; and
is operable to transition the wait signal to the proceed value when all of the delay signals have respective proceed values.

21. A method, comprising:
accessing a memory by transitioning bits in multiple sections of an address signal, the sections respectively corresponding to domains of the memory, the domains having respective access delays; and preventing subsequent access to the memory substantially for the longest of the access delays.

22. The method of claim 21 wherein the access delays are dependent on supply voltage.

23. The method of claim 21 wherein the access delays are dependent on temperature.

24. A method comprising:
accessing a memory by transitioning bits in multiple sections of an address signal, the sections respectively corresponding to domains of the memory, the domains having respective access delays; and
preventing subsequent access to the memory substantially for the longest of the access delays.
wherein preventing subsequent access to the memory comprises:
transitioning multiple delay signals to respective wait values in response to the transitioning of bits in the sections of the address signal, each delay signal corresponding to a respective one of the sections;
transitioning each of the delay signals to a respective proceed value after or approximately after the delay time of a domain that corresponds to the same section of the address signal as the delay signal; and
allowing subsequent access to the memory when all of the delay signals have proceed values.

25. A memory, comprising:
address domains that each have a respective delay time; and
a wait circuit operable to,
receive an address signal having multiple sections that each correspond to a respective one of the domains,
detect respective signal transitions in at least two of the sections,
transition a wait signal to a wait value in response to a detected signal transition, and
transition the wait signal to a proceed value after or approximately after the longest one of the delay times that correspond to the detected transitions.

26. The memory of claim 25, further comprising a pre-decode circuit coupled to the wait circuit and operable to generate the address signal from a raw address signal.

27. A data circuit, comprising:
a memory controller operable to receive a wait signal and to transition a coded address signal when the wait signal has a proceed value; and
a memory coupled to the memory controller and operable to generate the wait signal, the memory comprising,
address domains that each have a respective delay time,
a decode circuit operable to convert the coded address signal into a decoded address signal having sections that each correspond to a respective one of the domains, and
a wait circuit coupled to the decode circuit and operable to,
detect respective signal transitions in at least two of the sections of the decoded address signal,
transition the wait signal to a wait value in response to a detected signal transition, and
transition the wait signal to the proceed value after or approximately after the longest one of the delay times that correspond to the detected transitions.

28. An electronic system, comprising:
a data circuit, comprising,
a memory controller operable to receive a wait signal and to transition a coded address signal when the wait signal has a proceed value, and
a memory coupled to the memory controller and operable to generate the wait signal, the memory comprising,
address domains that each have a respective delay time,
a decode circuit operable to convert the coded address signal into a decoded address signal having sections that each correspond to a respective one of the domains, and
a wait circuit coupled to the decode circuit and operable to,
detect respective signal transitions in at least two of the sections of the decoded address signal,
transition the wait signal to a wait value in response to a detected signal transition, and
transition the wait signal to the proceed value after or approximately after the longest one of the delay times that correspond to the detected transitions.

* * * * *